United States Patent
Nelson

(10) Patent No.: US 6,172,630 B1
(45) Date of Patent: Jan. 9, 2001

(54) EXTENDED COMMON MODE INPUT RANGE FOR A DELTA-SIGMA CONVERTER

(75) Inventor: Theodore G. Nelson, Portland, OR (US)

(73) Assignee: Tektronix, Inc., Beaverton, OR (US)

( * ) Notice: Under 35 U.S.C. 154(b), the term of this patent shall be extended for 0 days.

(21) Appl. No.: 09/136,137

(22) Filed: Aug. 18, 1998

(51) Int. Cl.[7] .................................................. H03M 3/00
(52) U.S. Cl. ............................................ 341/143; 341/155
(58) Field of Search ................................. 341/143, 155, 341/172, 144, 118; 333/173

(56) References Cited

U.S. PATENT DOCUMENTS

| | | | |
|---|---|---|---|
| 5,030,954 | * | 7/1991 | Ribner ................................. 341/172 |
| 5,351,050 | * | 9/1994 | Thompson et al. ................. 341/143 |
| 5,392,043 | * | 2/1995 | Ribner ................................. 341/143 |
| 5,754,131 | * | 5/1998 | Ribner et al. ........................ 341/143 |

* cited by examiner

*Primary Examiner*—Peguy JeanPierre
(74) *Attorney, Agent, or Firm*—David N. Caracappa; Thomas F. Lenihan

(57) ABSTRACT

A delta-sigma modulator includes an integrator which includes an integrating amplifier having an input terminal and an output terminal. A pole of a first single-pole-double-throw (SPDT) switch is coupled to a first electrode of an input capacitor, while a first throw of the first SPDT switch is coupled to an input signal source, and a second throw is coupled to a source of reference potential (ground). A pole of a second SPDT switch is coupled to a second electrode of the capacitor, while a first throw of the second SPDT switch is coupled to the input terminal of the integrating amplifier. A feedback signal generator has an input terminal coupled to the output terminal of the integrating amplifier, and an output terminal directly coupled to a second throw of the second SPDT switch.

16 Claims, 2 Drawing Sheets

EXTENDED COMMON MODE INPUT RANGE FOR A DELTA-SIGMA CONVERTER

FIELD OF THE INVENTION

The present invention relates to a delta-sigma analog-to-digital converter (ADC), and in particular to a differential delta-sigma ADC with imp rov ed common mode input range performance which finds particular use in a digital multimeter (DMM).

BACKGROUND OF THE INVENTION

Digital multimeters (DMMs) a re well known test equipment which are used to provide many electrical measurements, including ratio-metric resistance measurement. Prior DMMs used RMS converters to perform this measurement. But RMS converters have relatively poor accuracy. Recently DMMs have included delta-sigma ADCS followed by digital signal processing (DSP) circuitry to perform this measurement. This arrangement has an improved accuracy compared to DMMs imp lemented using RMS converters. In addition, this arrangement provides improved AC voltage measurement, and makes it possible to provide other desired measurements, such as combined DC and AC vo ltage measurement.

It is known that a delta-sigma converter with a relatively wide common mode range is required to perform ratio-metric resistance measurements. It is also known that common mode range may be traded off against dynamic range; that is, common mode input range may be extended by decreasing the dynamic range. Decreasing the dynamic range, however, decreases the performance of the digital multimeter.

A delta-sigma ADC consists of two parts, a delta-sigma codulator, followed by a digital filter and decimator. The delta-sigma modulator generates an oversampled pulse-width-modulated (PWM) digital signal having an average voltage corresponding to the voltage of the input analog signal. The delta-sigma modulator reconverts the output PWM digital signal to an analog reference signal which is then fed back to the input of the delta-sigma modulator. One form of a delta-sigma modulator includes one or more serially connected integrators which have been implemented using known switched capacitor (SC) techniques.

Prior SC delta-sigma modulators include an input switched capacitor coupled between an input terminal receiving an analog input signal and an integrator. Thus, the input signal is AC coupled to the integrator. In one prior art arrangement, the feedback signal is coupled to the input terminal side of the input switched capacitor, via a feedback switched capacitor. In another prior art arrangement, the feedback signal is coupled to the integrator side of the input switched capacitor, also using a feedback switched capacitor. The gain of the feedback reference signal is controlled by the ratio of the feedback capacitor and the input capacitor. In both of the prior art arrangements, the feedback reference signal is also AC coupled to the amplifier through the feedback capacitor, and/or through the input capacitor as well. This restricts the common mode range of the ADC to the range of the reference feedback voltage.

A delta-sigma modulator which provides increased common mode range, without requiring a concomitant decrease in dynamic range is desirable.

In accordance with principles of the present invention, a delta-sigma modulator includes an integrator which includes an integrating amplifier having an input terminal and an output terminal. A pole of a first single-pole-double-throw (SPDT) switch is coupled to a first electrode of an input capacitor, while a first throw of the first SPDT switch is coupled to an input signal source, and a second throw is coupled to a source of reference potential (ground). A pole of a second SPDT switch is coupled to a second electrode of the capacitor, while a first throw of the second SPDT switch is coupled to the input terminal of the integrating amplifier. A feedback signal generator has an input terminal coupled to the output terminal of the integrating amplifier, and an output terminal directly coupled to a second throw of the second SPDT switch.

A delta-sigma modulator according to the present invention applies the feedback reference signal to the input terminal of the integrator without passing through a capacitor. The reference voltage, thus, is DC coupled to the input of the integrator while, the common mode input signal is AC coupled to the input terminal of the integrator by the input switched capacitors. This results in the common mode voltage being limited only by the supply voltage, and not by the reference voltage as in prior art delta-sigma converters. The dynamic range of the delta-sigma converter, however, is not affected by this arrangement.

DETAILED DESCRIPTION

Figure 1:
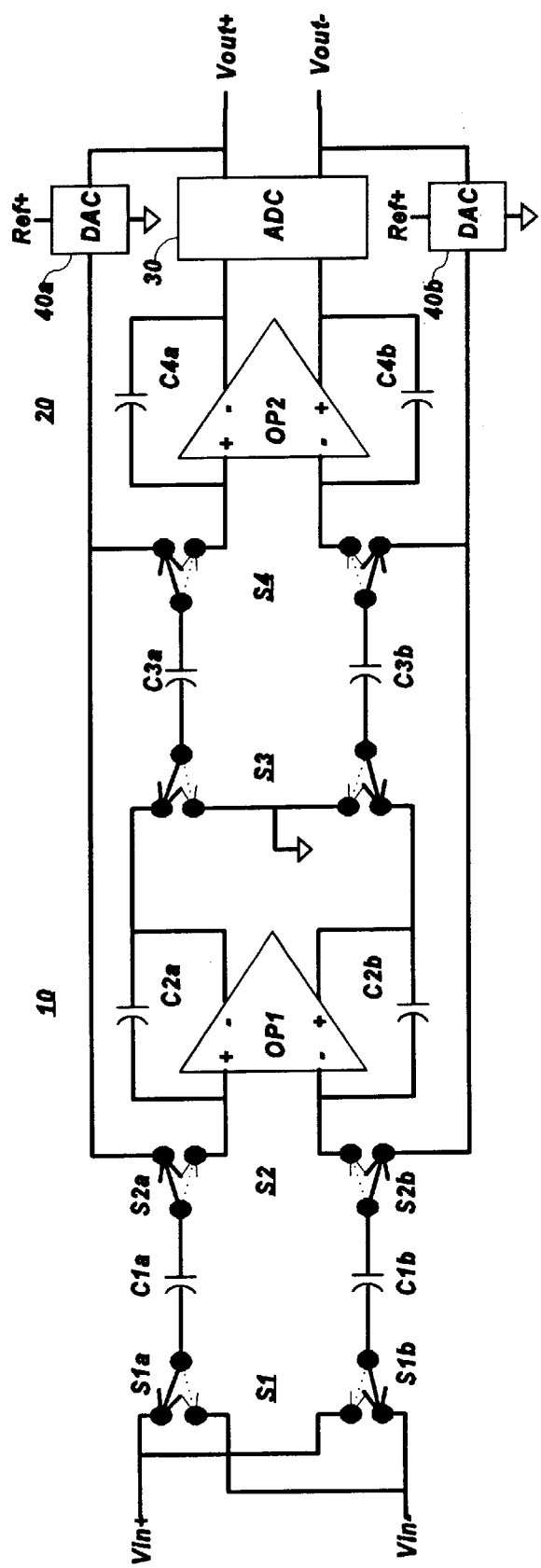
FIG. 1 is a schematic diagram of a differential delta-sigma modulator according to principles of the present invention.

FIG. 1 is a schematic diagram of a delta-sigma modulator according to principles of the present invention. In FIG. 1, a differential input terminal for the delta-sigma modulator comprises a non-inverting input terminal Vin+ and an inverting input terminal Vin−. The non-inverting input terminal Vin+ is coupled to respective first throws (switchable contacts) of a first section S1$a$ and a second section S1$b$ of a double pole double throw (DPDT) switch S1. The inverting input terminal Vin− is coupled to respective second throws of the first section S1$a$ and second section S1$b$ of the DPDT switch S1. A pole (non-moveable contact) of the first section S1$a$ of the DPDT switch S1 is coupled to a first electrode of a first input capacitor C1$a$, and a pole of the second section S1$b$ of the DPDT switch S1 is coupled to a first electrode of a second input capacitor C1$b$.

A second electrode of the first input capacitor C1$a$ is coupled to a pole of a first section S2$a$ of a second DPDT switch S2, and the second electrode of the second input capacitor C1$b$ is coupled to a pole of a second section S2$b$ of the second DPDT switch S2. A first throw of the first section S2$a$ of the second DPDT switch S2 is coupled to a non-inverting input terminal of a first operational amplifier OP1, and to a first electrode of a first feedback capacitor C2$a$. A first throw of the second section S2$b$ of the second DPDT switch S2 is coupled to an inverting input terminal of the first operational amplifier, and a first electrode of a second feedback capacitor C2$b$. The first and second input capacitors C1$a$ and C1$b$, and the first and second DPDT switches S1 and S2 form a differential pair of input switched capacitors having an input-side terminal coupled to the input signal source (not shown), and an amplifier-side terminal coupled to the input terminal of the first operational amplifier OP1.

An inverting output terminal of the first operational amplifier OP1 is coupled to a second electrode of the first feedback capacitor C2a, and a first throw of a first section S3a of a third DPDT switch S3. A non-inverting output terminal of the first operational amplifier OP1 is coupled to a second electrode of the second feedback capacitor C2b and to a first throw of a second section of the third DPDT switch S3. Respective second throws of the first section S3a and second section S3b of the third DPDT switch S3 are coupled to a source of a reference potential (ground). The combination of the first and second input capacitors, C1a and C1b, the first operational amplifier OP1, and the first and second feedback capacitors, C2a and C2b form a first differential integrator 10.

A pole of the first section S3a of the third DPDT switch S3 is coupled to a first electrode of a first coupling capacitor C3a, and a pole of the second section S3b of the third DPDT switch S3 is coupled to a first electrode of a second coupling capacitor C3b. A second electrode of the first coupling capacitor C3a is coupled to a pole of a first section S4a of a fourth DPDT switch S4, and a second electrode of the second coupling capacitor C3b is coupled to a pole of a second section S4b of the fourth DPDT switch S4. A first throw of the first section S4a of the fourth DPDT switch S4 is coupled to the non-inverting input terminal of a second operational amplifier OP2, and a first electrode of a third feedback capacitor C4a. A first throw of the second section S4b of the fourth DPDT switch S4 is coupled to an inverting input terminal of the second operational amplifier OP2 and to a first electrode of a fourth feedback capacitor C4b. The first and second coupling capacitors C3a and C3b, and the third and fourth DPDT switches S3 and S4 form a differential pair of coupling switched capacitors having an input-side terminal coupled to the output terminal of the first differential integrator 10, and an amplifier-side terminal coupled to the input terminal of the second operational amplifier OP2.

An inverting output terminal of the second operational amplifier OP2 is coupled to a first input terminal of an analog to digital converter (ADC) 30 and to a second electrode of the third feedback capacitor C4a. A non-inverting output terminal of the second operational amplifier OP2 is coupled to a second input terminal of the ADC 30 and to a second electrode of the fourth feedback capacitor C4b. The combination of the first and second coupling capacitors, C3a and C3b, the second operational amplifier OP2 and the third and fourth feedback capacitors, C4a and C4b, form a second, serially connected, differential integrator 20.

A first out terminal of the ADC 30 is coupled to a non-inverting output terminal Vout+ of the delta-sigma modulator, and an input terminal of a first digital to analog converter (DAC) 40a. A second output terminal of the ADC 30 is coupled to an inverting output terminal Vout− of the delta-sigma modulator, and an input terminal of a second DAC 40b. Each of the first and second DACs 40a and 40b is coupled to a source of a positive reference voltage Ref+, and to a source of a ground voltage. An output terminal of the first DAC 40a is coupled to respective second throws of the first section S4a of the fourth DPDT switch S4 and the first section S2a of the second DPDT switch S2. An output terminal of the second DAC 40b is coupled to respective second throws of the second section S4b of the fourth DPDT switch S4 and the second section S2b of the second DPDT switch S2. The illustrated embodiment is termed a second order differential switched capacitor delta-sigma modulator.

In operation, the first, second, third and fourth DPDT switches S1, S2, S3 and S4 switch synchronously in response to a periodic clock signal (not shown). The switches, S1, S2, S3 and S4, may be semiconductor switches fabricated in any one of several known configurations, and may operate in a known break-before-make manner. The switches, S1, S2, S3 and S4, are synchronized to be in one of two positions. A first position is illustrated in FIG. 1, and a second position is illustrated in phantom in FIG. 1, all in a known manner. When the switches are in the first position (illustrated in FIG. 1), the input capacitors C1a and C1b, and the coupling capacitors C3a and C3b accumulate charge representing the difference between the reference feedback signal from the first and second DACs, 40a and 40b and the input signal Vin or the signal from the first integrator 10, respectively. When the switches are in the second position (illustrated in phantom in FIG. 1), the accumulated charge on the input capacitors C1a and C1b is transferred to and integrated by the feedback capacitors C2a and C2b, and the accumulated charge in the coupling capacitors C3a and C3b is transferred to and integrated by the feedback capacitors C4a and C4b.

Figure 2:
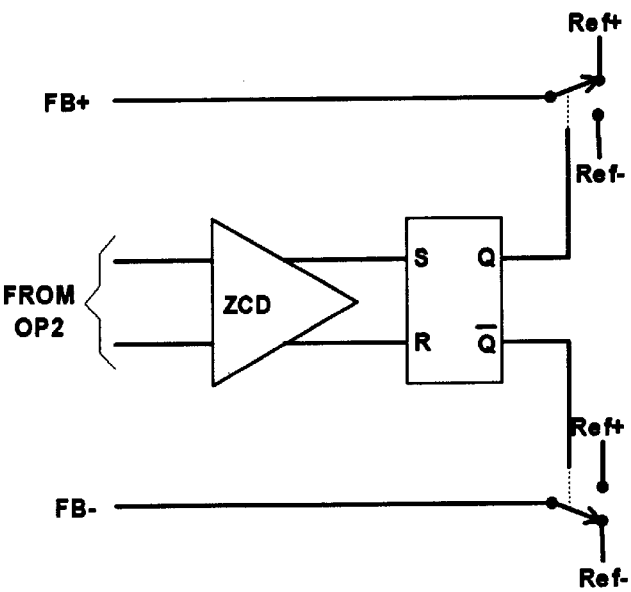
FIG. 2 is a more detailed diagram partially in block form and partially in schematic form of a feedback circuit consisting of an ADC and DAC as illustrated in FIG. 1.

The output from the second integrator 20 is converted to a PWM digital signal by the ADC 30, and the PWM digital signal from the ADC 30 is converted to respective feedback reference signals by the DACs 40a and 40b, all in a known manner. In a preferred embodiment, the ADC 30 is a single bit ADC, and the first and second DACs, 40a and 40b, are single bit DACS. FIG. 2 is a more detailed diagram partially in block form and partially in schematic form of such a feedback circuit consisting of a single bit ADC 30 and single bit first and second DACs,. 40a and 40b, as illustrated in FIG. 1. In FIG. 2, the differential output terminal from the second operational amplifier OP2 (of FIG. 1) is coupled to a differential input terminal of a zero-crossing detector (ZCD) 32. A differential output terminal of the ZCD 32 is coupled to respective set S and reset R input terminals of a set-reset (S-R) flip flop 34. A Q output terminal of the S-R flip flop 34 produces the non-inverting output signal from the delta-sigma modulator, and is coupled to the non-inverting output terminal Vout+ (not shown), and a control terminal of a first controlled SPDT switch 40a. A $\overline{Q}$ output terminal of the S-R flip flop 34 produces the inverting output signal from the delta-sigma modulator, and is coupled to the inverting output terminal Vout− (not shown), and a control terminal of a second controlled SPDT switch 40b. The combination of the ZCD 32 and S-R flip flop 34 forms the ADC 30 (of FIG. 1).

Respective first throws of the first and second controlled SPDT switches 40a and 40b are coupled to a source of a positive reference voltage Ref+, and respective second throws of the first and second controlled SPDT switches 40a and 40b are coupled to ground. A pole of the first controlled SPDT switch 40a produces a non-inverted feedback reference signal FB+, and is coupled to the respective second throws of the first portions of the second DPDT switch S2 and the fourth DPDT switch S4. A pole of the second controlled SPDT switch 40b produces an inverted feedback reference signal FB−, and is coupled to the respective second throws of the second portions of the second DPDT switch S2 and the fourth DPDT switch S4. The first controlled switch 40a forms the first DAC 40a and the second controlled switch 40b forms the second DAC (both of FIG. 1). The ADC 30 formed by the ZCD 32 and S-R flip flop 34, and the first and second DACs, 40*a* and 40*b*, formed by the first and second controlled switches 40*a* and 40*b*, respectively, operate in a known manner, and will not be described in detail below.

Figure 3:
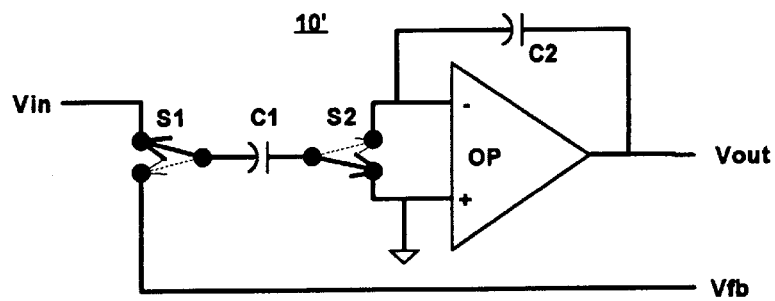
FIGS. 3 and 4 are simplified schematic diagrams of a single-ended delta-sigma modulator useful in understanding the operation of the differential delta-sigma modulator illustrated in FIG. 1.
Figure 4:
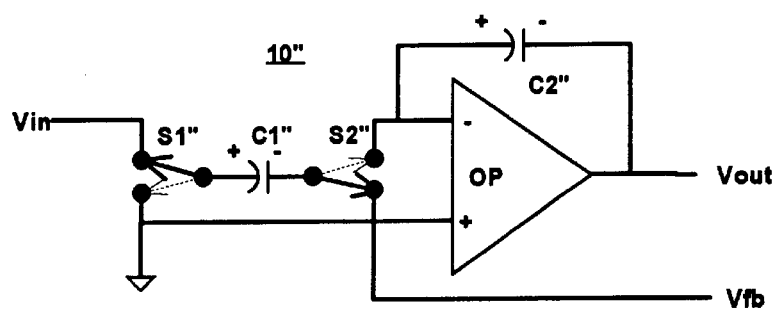

The advantageous operation of the delta-sigma modulator illustrated in FIG. 1 may be better understood by reference to FIGS. 3 and 4. FIG. 3 illustrates the input integrator stage 10' of a single-ended switched capacitor type as implemented in the prior art. In FIG. 3, a single-pole-double-throw (SPDT) switch S1' corresponds to the first section S1*a* of the DPDT switch S1, the input capacitor C1' corresponds to the first input capacitor C1*a*, and an SPDT switch S2' corresponds to the first section S2*a* of the second DPDT S2, all of FIG. 1. When the switches S1' and S2' are in the first position, illustrated in FIG. 3, the input capacitor C1' stores charge representing the level of the input signal Vin. When the switches S1' and S2' are in the second position, illustrated in phantom in FIG. 3, the stored charge, representing the level of the input signal Vin, is connected between the feedback reference voltage signal Vfb and the input terminal of the operational amplifier OP. In this manner, a charge equal to the difference between the level of the input signal and that of the feedback reference signal is coupled to the operational amplifier OP, and integrated by the feedback capacitor C2'.

To illustrate the operation of the delta-sigma modulator illustrated in FIG. 3, assume that initially the switches S1' and S2' are in the second position (illustrated in phantom) and that the voltage across the feedback capacitor C2' is zero volts, the feedback reference voltage is two volts, the input voltage Vin is one volt, and that the voltage across the input capacitor C1' is one volt (see equation (1)). When the switches $$V_{C2}=0V; \; Vfb=2V; \; Vin=1V; \; \text{and} \; V_{C1}=1V \tag{1}$$

S1' and S2' switch to the first position, as illustrated, the input capacitor C1' is coupled between the input terminal and ground, and is charged to the input voltage Vin, i.e. one volt. The feedback capacitor C2' is isolated from the remainder $$V_{C1}=1V; \; \text{and} \; V_{C2}=0V \tag{2}$$

of the circuit, and its voltage remains at zero volts (see equation (2)). When the switches S1' and S2' are switched back to the second position (phantom), the feedback reference voltage Vfb is coupled through the input capacitor C1' to the input of the operational amplifier OP. The voltage at the input terminal of the operational amplifier OP is the difference between the feedback reference voltage (2 volts) and the voltage across the input capacitor (1 volt), or 1 volt. The operational amplifier OP charges the feedback capacitor to 1 volt. The output voltage, thus becomes −1 volts (see equation $$V_{C1}=2V; \; V_{C2}=1V; \; \text{and} \; Vout=-1V \tag{3}$$

(3)).

FIG. 4 illustrates an input integrator stage 10" of a single-ended switched capacitor sigma-delta modulator arranged according to the present invention. In FIG. 4, the connections of the ground and feedback reference signal Vfb to the switches S1" and S2" are reversed with respect to those in FIG. 3. More specifically, in the prior art arrangement of FIG. 3, the feedback reference signal Vfb is coupled to the input terminal side of the switched capacitor C1' through switch S1', while in FIG. 4, the feedback reference signal Vfb is coupled to the integrator side of the input switched capacitor C1" through switch S2".

To illustrate the operation of the delta-sigma modulator illustrated in FIG. 4, assume again that initially the switches S1" and S2" are in the second position (illustrated in phantom) and that the voltage across the feedback capacitor C2" is zero, the feedback reference voltage is two volts, and the input voltage Vin is one volt. In this case, however, the voltage across the input capacitor C1" is zero volts, for reasons which will be described below (see equation (4)). When the switches $$V_{C2}=0V; \; Vfb=2V; \; Vin=1V; \; \text{and} \; V_{C1}=0V \tag{4}$$

S1" and S2" switch to the first position, as illustrated, the input capacitor C1" is coupled between the input terminal and the feedback reference signal terminal, and is charged to the difference between the input voltage (1V) and the feedback reference voltage (2V), i.e. −1 volts. The feedback capacitor C2" is isolated from the remainder of the circuit, and its voltage remains at zero volts (see equation(5)). When the $$V_{C1}=-1V; \; \text{and} \; V_{C2}=0V \tag{5}$$

switches S1" and S2" are switched back to the second position (phantom), the negative of the voltage across the input capacitor C1" is coupled to the input terminal of the operational amplifier OP, i.e. the voltage at the input terminal of the operational amplifier OP is +1 volt. The operational amplifier OP charges the feedback capacitor to 1 volt. As before, the output voltage, thus, becomes −1 volts (see equation (6)).

$$V_{C1}=2V; \; V_{C2}=1V; \; \text{and} \; Vout=-1V \tag{6}$$

In short, the prior art arrangement of FIG. 3, in a first switch position, charges the input switched capacitor C1' to the input voltage Vin, then in a second switch position, subtracts the input voltage previously stored in the input switched capacitor C1' from the feedback reference voltage Vfb, and applies that difference to the input terminal of the integrator (OP). The arrangement according to the present invention, FIG. 4, in a first switch position, charges the input switched capacitor C1" to the difference between the input voltage Vin and the feedback reference voltage Vfb, then in a second switch position, applies that difference to the input terminal of the integrator (OP). The signal processing, thus, is identical.

However, as can be seen in the differential arrangement illustrated in FIG. 1, the feedback reference signal is coupled from the DACs 40*a* and 40*b* to the switches (S2*a* and S2*b*, respectively) coupled to the amplifier sides of the input switched capacitors (C1*a* and C1*b*, respectively), and to the switches (S4*a* and S4*b*, respectively) coupled to the amplifier sides of the coupling switched capacitors (C3*a* and C3*b*, respectively). Thus, the feedback reference signal Vfb is DC coupled to the input terminals of the respective amplifiers OP1 and OP2. The input signal, on the other hand, is AC coupled to the input terminals of the respective amplifiers OP1 and OP2 through the input switched capacitors C1*a* and C2*a* and the coupling switched capacitors C3*a* and C3*b* respectively. Consequently, the feedback reference voltage is isolated from the common mode component in the input signal, and the common mode range of the input signal is not limited by the reference signal. Instead, the common mode voltage of the input signal can exceed the feedback reference voltage, and is limited by the supply voltage only.

The performance of the delta-sigma modulators illustrated in FIGS. 3 and 4 are the same, and these circuits have the same gain. Referring again to FIG. 1, it can be seen that the first integrator stage 10 is arranged in the same manner as that illustrated in FIG. 4, but in a differential configuration.

The second integrator stage 20 is arranged in a similar manner taking its input signal from the output of the first integrator stage. Thus, the delta-sigma modulator illustrated in FIG. 1 can provide a common mode input range limit only by the supply voltage, not by the reference voltage.

In general, the dynamic range is not, and does not need to be, reduced by this arrangement. However, in the embodiment illustrated in FIGS. 1 and 2, an additional enhancement is made. In prior art arrangements, the single-bit DACs in the feedback circuit, corresponding to the DACs 40a and 40b in FIGS. 1 and 2, produce an output signal which has a voltage of either a positive reference voltage Ref+ or a negative reference voltage Ref−. Specifically, referring to FIG. 2, in the prior art the second throws of both of the first SPDT switch 40a, and the second SPDT switch 40b, were coupled to a source of negative reference potential Ref−, instead of to ground as illustrated. The dynamic range of this arrangement ran from Ref− to Ref+. This, however, required a negative reference voltage source, and that the magnitude of the voltage produced by that voltage source be closely matched to the magnitude of the positive reference voltage Ref+. The dynamic range of the circuit of FIGS. 1 and 2 runs from −½(Ref+) to +½(Ref+). However, because the embodiment illustrated in FIG. 2 does not require a negative reference voltage source, it does not have the problem of matching the magnitudes of the positive and negative reference voltage source.

What is claimed is:

1. A delta-sigma modulator, comprising:
   an integrator, comprising:
   an integrating amplifier having an input terminal and an output terminal;
   a capacitor;
   a first single-pole-double-throw (SPDT) switch having a movable contact coupled to a first electrode of the capacitor, a first stationary contact coupled to an input signal source, and a second first stationary contact coupled to a source of reference potential (ground); and
   a second SPDT switch having a movable contact coupled to a second electrode of the capacitor, a first stationary contact coupled to the input terminal of the integrating amplifier, and a second stationary contact; and
   a feedback signal generator, having an input terminal coupled to the output terminal of the integrating amplifier, and an output terminal directly coupled to the second stationary contact of the second SPDT switch.

2. The modulator of claim 1 wherein the integrating amplifier comprises:
   an operational amplifier having an inverting input terminal coupled to the input terminal of the integrating amplifier, a non-inverting input terminal coupled to a source of reference potential, and an output terminal coupled to the output terminal of the integrating amplifier; and
   a feedback capacitor coupled between the output terminal and the inverting input terminal of the operational amplifier.

3. The modulator of claim 1 wherein the feedback signal generator comprises:
   an analog to digital converter (ADC) coupled to the output terminal of the integrating amplifier; and
   a digital to analog converter (DAC) coupled between the ADC and the second stationary contact of the second SPDT switch.

4. The modulator of claim 3 wherein:
   the ADC is a single-bit ADC; and
   the DAC is a single-bit DAC.

5. The modulator of claim 3 wherein the ADC comprises:
   a zero crossing detector coupled to the output terminal of the integrating amplifier; and
   a flip flop coupled to the zero crossing detector.

6. The modulator of claim 3 wherein the DAC comprises a controlled single-pole-double-throw switch having a movable contact coupled to the second throw of the second SPDT switch, a first stationary contact coupled to a source of a positive feedback reference voltage, a second stationary contact coupled to ground, and a control input terminal coupled to the ADC.

7. delta-sigma modulator, comprising:
   a differential integrator, comprising:
   a differential integrating amplifier having an inverting input terminal, a non-inverting input terminal and an output terminal;
   first and second input capacitors;
   a first single-pole-double-throw (SPDT) switch having a movable contact coupled to a first electrode of the first input capacitor, a first stationary contact coupled to a non-inverted input signal source, and a second stationary contact coupled to an inverted input signal source;
   a second SPDT switch having a movable contact coupled to a first electrode of the second input capacitor, a first stationary contact coupled to the inverted input signal source, and a second stationary contact coupled to the non-inverted input signal source;
   a third SPDT switch having a movable contact coupled to a second electrode of the first input capacitor, a first stationary contact coupled to the non-inverting input terminal of the integrating amplifier, and a second stationary contact; and
   a fourth SPDT switch having a movable contact coupled to a second electrode of the second input capacitor, a first stationary contact coupled to the inverting input terminal of the integrating amplifier, and a second stationary contact; and
   a feedback signal generator, having an input terminal coupled to the output terminal of the integrating amplifier, a non-inverting output terminal directly coupled to the second stationary contact of the third switch and an inverting output terminal directly coupled to the second stationary contact of the fourth switch.

8. The delta-sigma modulator of claim 7 wherein the differential integrating amplifier comprises:
   a differential operational amplifier having a non-inverting input terminal, an inverting input terminal, a non-inverting output terminal and an inverting output terminal;
   a first feedback capacitor coupled between the inverting output terminal of the operational amplifier and the non-inverting input terminal of the operational amplifier; and
   a second feedback capacitor coupled between the non-inverting output terminal of the operational amplifier and the inverting input terminal of the operational amplifier.

9. The delta-sigma modulator of claim 7 wherein the feedback signal generator comprises:
   an analog to digital converter (ADC) coupled to the output terminal of the integrating amplifier; and a digital to analog converter (DAC) circuit coupled between the ADC and the differential input terminal of the integrating amplifier.

10. The delta-sigma modulator of claim 9 wherein the ADC comprises:

a zero crossing detector, having an input terminal coupled to the output terminal of the integrating amplifier; and a flip-flop coupled to the zero crossing detector.

11. The delta-sigma modulator of claim 10 wherein:

the zero crossing detector has a non-inverting output terminal and an inverting output terminal; and the flip flop is a set-reset flip flop having a set input terminal coupled to a non-inverting output terminal of the zero crossing detector, a reset input terminal coupled to an inverting output terminal of the zero crossing detector, a Q output terminal forming a non-inverting output terminal of the ADC, and a $\bar{Q}$ output terminal forming an inverting output terminal of the ADC.

12. The delta-sigma modulator of claim 11 wherein the DAC circuit comprises:

a first DAC coupled between the Q output terminal of the flip flop, and the second stationary contact of the fourth SPDT switch; and a second DAC coupled between the output terminal of the flip flop and the second stationary contact of the third SPDT switch.

13. delta-sigma modulator of claim 9 wherein the DAC circuit comprises:

a first DAC coupled between an inverting output terminal of the ADC and the second stationary contact of the third SPDT switch; and a second DAC coupled between a non-inverting output terminal of the ADC and the second stationary contact of the fourth SPDT switch.

14. The delta-sigma modulator of claim 13 wherein:

the first DAC comprises a fifth controlled single-pole-double-throw (SPDT) switch having a movable contact coupled to the second throw of the third SPDT switch, a first stationary contact coupled to a source of a positive feedback reference potential, a second stationary contact coupled to ground, and a control input terminal coupled to the ADC;

the second DAC comprises a sixth controlled SPDT switch having a movable contact coupled to the second stationary contact of the fourth SPDT switch, a first stationary contact coupled to the source of the positive feedback reference potential, a second stationary contact coupled to ground, and a control input terminal coupled to the ADC.

15. The delta-sigma modulator of claim 7, further comprising a second differential integrator, coupled between the first mentioned differential integrator and the feedback signal generator, the second differential integrator comprising:

a second differential integrating amplifier having an inverting input terminal, a non-inverting input terminal and an output terminal;

first and second coupling capacitors;

a fifth SPDT switch having a movable contact coupled to a first electrode of the first coupling capacitor, a first stationary contact coupled to an inverting output terminal of the first mentioned differential integrator, and a second stationary contact coupled to ground;

a sixth SPDT switch having a movable contact coupled to a first electrode of the second coupling capacitor, a first stationary contact coupled to the non-inverting output terminal of the first mentioned differential integrator, and a second stationary contact coupled to ground;

a seventh SPDT switch having a movable contact coupled to a second electrode of the first coupling capacitor, a first stationary contact coupled to a non-inverting input terminal of the second differential integrator, and a second stationary contact coupled to the inverting output terminal of the feedback signal generator, and an eighth SPDT switch having a movable contact coupled to a second electrode of the second coupling capacitor, a first stationary contact coupled to the inverting input terminal of the second differential integrator, and a second stationary contact coupled to the non-inverting output terminal of the feedback signal generator.

16. The delta-sigma modulator of claim 15 wherein the second differential integrating amplifier comprises:

an operational amplifier having a differential input terminal and a differential output terminal;

a first feedback capacitor coupled between the inverting output terminal and the non-inverting input terminal of the operational amplifier; and a second feedback capacitor coupled between the non-inverting output terminal and the inverting terminal of the differential input terminal of the operational amplifier.

* * * * *